United States Patent [19]

Ingram et al.

[11] 4,331,831
[45] May 25, 1982

[54] PACKAGE FOR SEMICONDUCTOR INTEGRATED CIRCUITS

[75] Inventors: Arthur J. Ingram; Irving Weingrod, both of Allentown, Pa.

[73] Assignee: Bell Telephone Laboratories, Incorporated, Murray Hill, N.J.

[21] Appl. No.: 210,776

[22] Filed: Nov. 28, 1980

[51] Int. Cl.³ .............................................. H05K 1/06
[52] U.S. Cl. ................................ 174/52 FP; 357/70; 357/81
[58] Field of Search ...................... 174/52 FP, 52 PE; 357/74, 70, 81

[56] References Cited

U.S. PATENT DOCUMENTS

| 3,859,718 | 1/1975 | Noe . | |
|---|---|---|---|
| 3,930,114 | 12/1975 | Hodge | 174/52 FP |
| 3,968,563 | 7/1976 | Hamlin | 29/591 |
| 4,132,856 | 1/1979 | Hutchison et al. | 174/52 PE |
| 4,210,926 | 7/1980 | Hacke | 357/70 |
| 4,214,120 | 7/1980 | Jones et al. | 174/52 FP |

OTHER PUBLICATIONS

"Automated Tape Carrier Bonding for Hybrids", R. G. Oswald et al., Solid State Technology, vol. 21, No. 3, Mar. 1978, pp. 39-48.
"Metallurgical Considerations for Beam Tape Assembly", A. S. Rose et al., Solid State Technology, vol. 21, No. 3, Mar. 1978, pp. 49-52.
"Beam Tape Carriers-A Design Guide", R. L. Cain, Solid State Technology, vol. 21, No. 3, Mar. 1978, pp. 53-58.
"Packaging Technology Responds to the Demand for Higher Densities", J. Lyman, Electronics, Sep. 28, 1978, pp. 117-125.
"BTAB's Future-An Optimistic Prognosis", R. F. Unger et al., Solid State Technology, Mar. 1980, pp. 77-83.

Primary Examiner—B. A. Reynolds
Assistant Examiner—D. A. Tone
Attorney, Agent, or Firm—H. W. Lockhart

[57] ABSTRACT

A plastic encapsulation of the chip carrier type for a semiconductor integrated circuit is described. The package includes a lead frame member formed from a continuous metal tape which permits reel-to-reel automatic processing. The lead frame member provides the entire means for connecting from electrodes on the active or front surface of the semiconductor chip to contact members external to the encapsulation. The lead frame member also includes integral backside contact members providing electrical and thermal contact to the back surface of the semiconductor chip. The backside contact members similarly are integral with contact members external to the encapsulation. The interconnected structure including the lead frame member and semiconductor chip is housed in a molded plastic encapsulation. The package is capable of very small dimensions and is adapted for a high degree of automatic fabrication, including handling in stick-type magazines for subsequent operations such as testing, aging, and assembly.

3 Claims, 5 Drawing Figures

PACKAGE FOR SEMICONDUCTOR INTEGRATED CIRCUITS

BACKGROUND OF THE INVENTION

This invention relates to encapsulations for semiconductor integrated circuit chips and more particularly to molded plastic encapsulations using lead frames for interconnecting means.

Semiconductor chips are encapsulated both for protection, and for convenience in interconnecting the chip circuits with terminals on mounting media such as printed circuit boards. Encapsulation also facilitates testing and the automatic assembly of chips into apparatus. There is a considerable variety of integrated circuit chip packages, but of chief interest are the nonhermetic, post-molded plastic types known as the dual-in-line package and the chip carrier type. Standard exist or are under development for packages of these types which prescribe general dimensions, types of external contacts, and contact spacing.

However, the encapsulation of semiconductor devices constitutes a considerable proportion of the total cost of a completed device. Accordingly, there is a continuing effort to develop packages and encapsulation techniques which reduce cost, provide high reliability, and which are compact in size. Automatic fabrication, test, and assembly techniques contribute to lower cost and higher reliability. It is desirable also, that a particular package design accommodate, with little or no change in that design, a variety of different semiconductor chips. As a consequence, the total number of package sizes required for all chip sizes is minimized.

Accordingly, an object of this invention is a package design which can be readily adapted to different semiconductor chip sizes and configurations by relatively simple modifications.

Another object is a package design consistent with a high degree of automation from initial fabrication through test procedures and final assembly. Ancillary to this object is a design consistent with reel-to-reel processing using beam tape.

A further object is a package design adapted for handling in linear magazines, generally known as sticks, thereby enabling a high degree of automation in testing, aging, shipping, and other post-fabrication operations.

A further object is a package design adapted to provide an external electrical backside contact, as well as heat dissipation by conduction into the mounting substrate by convection from an extended backside surface.

Another object is a package design having a minimum number of lead contacts between chip contact and the contact external to the package. Ancillary to this object is a lead design contributing to superior electrical performance.

Another object is a package design which is compact in size.

SUMMARY OF THE INVENTION

The foregoing objects are met in the embodiment in accordance with the invention comprising a molded plastic encapsulation for a semiconductor integrated circuit chip incorporating a lead frame formed from a beam tape, typically by etching. The lead frame provides for a unitary lead member from each electrode on the chip to an external contact. In this respect, a unitary lead member is a single continuous element from the internal contact to the external contact, there being no intermediate contact points. Each lead terminates at its inner end in a bonding area bonded to the chip electrode. As used herein, the term "bonded" is intended to encompass all known means of making conductive attachment including, but not restricted to, thermal compression bonding, thermosonic and ultrasonic bonding, eutectic and conductive adhesive bonding, soldering, brazing, and various forms of welding. The portion of the lead adjoining the bonding area is of reduced cross-section, thus avoiding the excessive, thermally-induced stress buildups usually accompanying the direct bonding of such a member.

The lead frame inclucdes also integral backside contact members for contact to the back surface of the chip, each of which has an integral lead to a contact external to the package. These backside contacts enhance the mechanical integrity of the semiconductor chip to the lead frame, as well as providing a highly efficient thermal path, heat spreader, and electrical connection, if so desired.

Thus, a primary feature of this embodiment having a lead frame member is the absence of intermediate contacts between the electrodes on the semiconductor chip and the contacts external to the package. This arragement both enhances reliability and reduces cost. Thermal and electrical performance is enhanced by minimizing the length of the path between internal and external contacts.

Furthermore, the lead frame member, which usually is etched from the beam tape using known masked chemical etching methods, provides a high degree of design flexibility. Lead frames to accommodate a variety of different patterns of integrated circuit chips are fabricated simply by prescribing a different etch mask to produce the desired lead frame configuration. Often, only the innermost fan-out to the chip contacts needs to be changed.

Further, in accordance with a particular embodiment of the invention, the encapsulation process is substantially continuous from the shaping of the beam tape into lead frames, through the plastic molding, excising of the package from the tape, trimming and shaping of the lead members, and finally insertion in a stick magazine for testing, aging, and assembly into apparatus. Although substantially continuous, the process also permits batch processing.

BRIEF DESCRIPTION OF THE DRAWING

The invention and its other objects and features will be better understood from the following detailed description taken in conjunction with the drawing in which.

DETAILED DESCRIPTION

Figure 1:
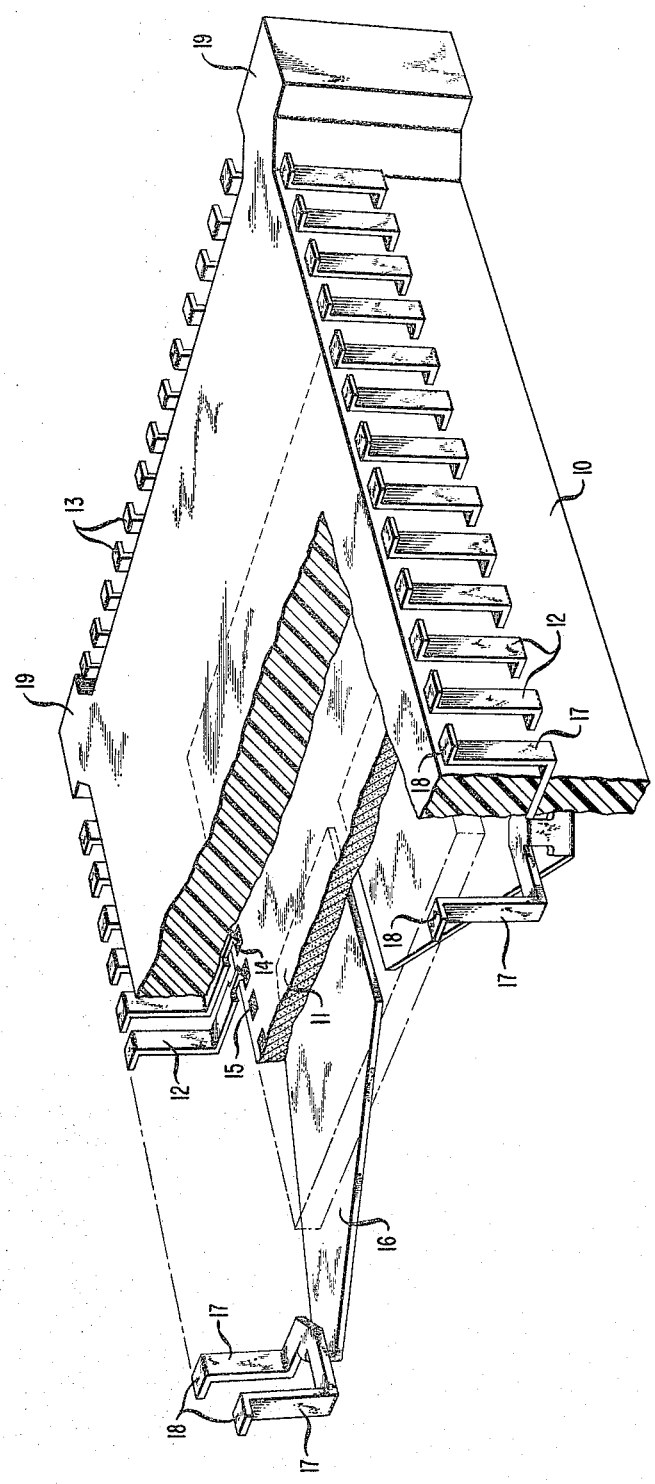
FIG. 1 is a perspective view, partially cut away and sectioned of an embodiment of the invention.

FIG. 1 shows, in perspective, a chip carrier comprising a post-molded plastic body member 10 which holds the various elements of the encapsulation in cooperative relation and provides a package outline suitable for stick-type handling equipment. The carrier is partially cut away in sections to illustrate the arrangement of the various elements within the molded plastic body member 10.

The semiconductor chip 11 is disposed within the body member 10. In the drawing, the front or active face of the chip is uppermost and has thereon a plurality of electrodes 15 comprised of metal areas for making connection to the semiconductor integrated circuit.

Interconnection between the electrodes 15 on the semiconductor chip 11 and the external contacts 13 is by way of the lead members 12. On the front face of the chip, internal to the package, the lead members 12 terminate in finger portions 14, the tips of which include an area adapted for bonding to a chip electrode 15. External to the body 10, the lead members 12 terminate in external contacts 13, adapted for making contact to terminal areas on interconnecting circuit apparatus, including thick and thin film ceramic elements and rigid and flexible printed circuit boards. Such contacts may rely on spring pressure, bonding, welding, or soldering. Although shown in this embodiment as L-shaped feet for surface mounting, the leads 12 and contacts 13 could as well be adapted for another type of connection, for example, by insertion into holes in a mounting member. Alternatively, the leads 12 and external contacts 13 may be bent in the opposite direction with respect to the orientation of the semiconductor chip. This results in a mirror image connection of the electrodes 15 on the semiconductor chip 11 to the terminal areas on the interconnecting circuit apparatus with no changes to the semiconductor chip. Importantly, each lead member 12 is one single continuous element from the frontside finger portion 14 to the external contact 13. There are no intermediate connections which tend to add to the cost and reduce reliability.

The under or backside of the semiconductor chip 11 is contacted by four relatively large paddle-like tab members 16 which likewise are shaped in the beam tape. Each tab member 16, in turn, is connected to and integral with a pair of lead members 17 terminating in external contacts 18. The lead members 17 are placed at the ends of the rows of lead members 12. The tab members 16 provide large area mechanical support for the semiconductor chip 11, as well as thermal contact and electrical contact thereto, if the latter is desired. Typically, the tab members 16 are bonded conductively to the backface of the chip 11 and provide for heat dissipation by both convection and conduction and by the spreading of heat within the silicon semiconductor chip.

Figure 2:
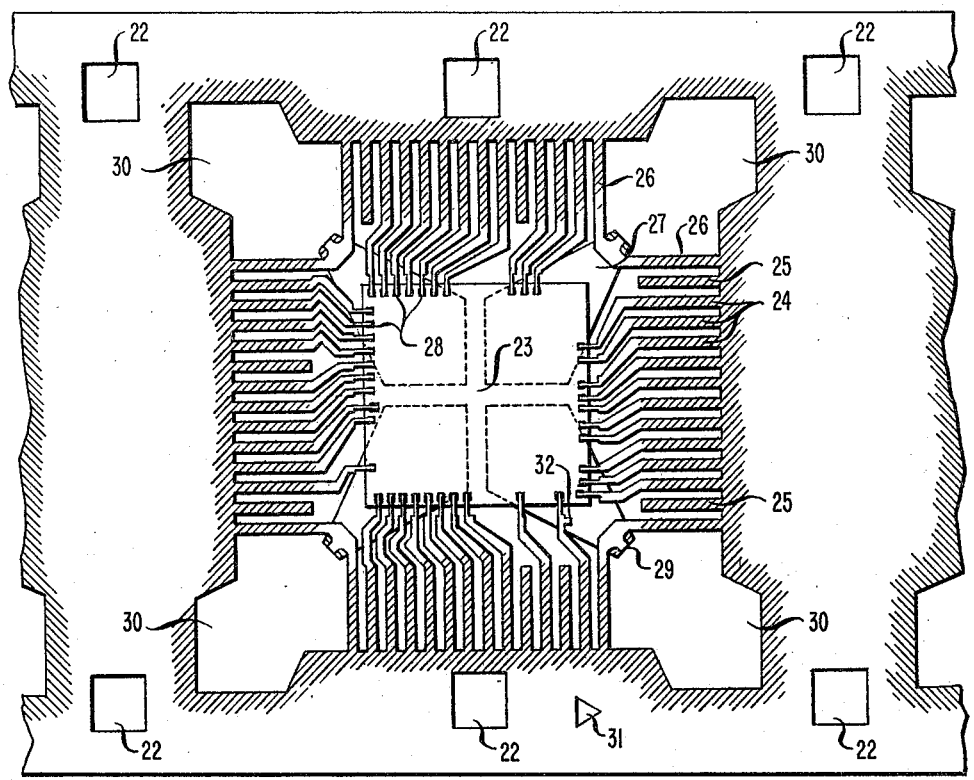
FIG. 2 is a plan view of a single lead frame shaped in a portion of a beam tape.

As shown in the drawing, the tab members 16 in FIG. 1, and 27 in FIG. 2, contact substantially 80 percent of the backside of the chip. Thus, each tab of the four may contact about 20 percent, a large area compared to the finger portions 14 on the front side.

Alternatively, other arrangements of backside contacts formed integrally from the lead frame may be arranged. The number, shape, and disposition of the tab members 16 may differ from that shown. For example, another arrangement may have two tab members disposed centrally on opposite sides of the chip rather than at the corners. Likewise, a considerable variety of arrangements of lead members for the tab members may be used.

Further features of the chip carrier structure of FIG. 1 will become apparent from the manner in which the encapsulation is made. In particular, the unitary structure of each contact lead 12 for the front side contacts or each contact lead 17 for the backside contacts stems from the way in which the lead frame is produced and assembled. FIG. 2 shows a portion 20 of one beam tape of the type adapted for transporting, reel-to-reel with precise positioning at work stations. For this purpose, the tape is furnished with sprocket holes 22. The triangular hole 31 is an identification and orientation mark. The tape 21 typically a gold-plated copper foil having a thickness typically of about four mils (0.004 inch).

Alternatively, the copper foil may be of other thicknesses and may be plated with other metals such as tin, or may be unplated. Likewise, other conductive metals, such as aluminum and suitable ferrous alloys, may be used instead of copper foil.

FIG. 2 shows the portion 20 of the tape, shaped to provide the lead frame and assembled, by bonding, to a semiconductor chip 23. Several processing steps intervene between the provision of the beam tape and the assembly shown in FIG. 2. First of all, an etch-resistant mask is formed on the tape to define a specific configuration of the lead frame. This mask defines the various frontside contact members 24 and the contact members 26 to the backside contact tabs 27. In this specific embodiment, the backside contact tabs 27 also are shaped in the tape in the vacancies 30 at the corners of the lead frame pattern. Thus, the lead frame is patterned in the tape in a single plane and comprises the array of lead members 24 which terminate in a frontside contacts, lead members 25 which are unused, and lead members 26 which terminate in the backside tabs 27.

Figure 3:
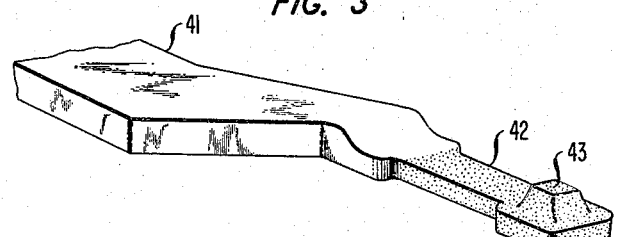
FIG. 3 is a perspective view of the inner end of the front side contact member in accordance with one embodiment.

Turning to FIG. 3, the end portion 41 of a frontside contact lead 24 of FIG. 2 is shown turned over in order to show the bonding pad 43 at the tip of the lead and the adjoining portion 42 of reduced cross-section. This configuration of bonding area and reduced cross-section portion likewise is formed by means of a specialized masking and etching operation. The adjoining portion 42 of reduced cross-section provides strain relief for thermally induced stresses to avoid attachment failures at the contact on the semiconductor chip.

Figure 4:
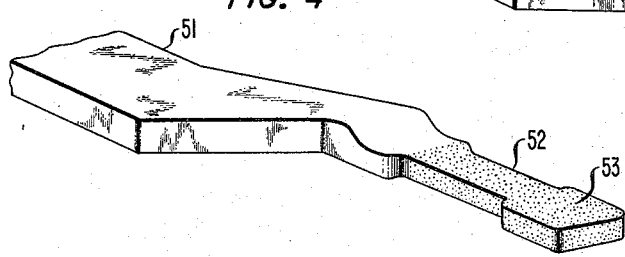
FIG. 4 is similar to FIG. 3 showing another embodiment.

An alternative arrangement for the end portion 51 of the frontside contact lead is shown in FIG. 4. In this configuration, it is advantageous to provide a raised electrode on the semiconductor chip to which the area 53 of the lead is bonded. Strain relief is provided by a portion 52 adjoining the bonding area 53 in which the cross-section is reduced.

After the lead frame is formed in the beam tape, it may be coated in whole or in part with one or more thin layers of metal. Next, the lead frame is positioned in contact with a semiconductor chip 23 with the tips of the frontside contact members 24 over electrode members 28 on the semiconductor chip. A tool then is applied to attach the bonding pads 43 to the chip electrodes 28. The lead frame shown in FIG. 2 comprises a standard array of fourteen lead members on each of four sides, thus totaling 56. This is one specific configuration in a family of lead frames of similar size and shape. As shown, the end lead members 26, totaling eight in number, are utilized for making external contacts for the backside contact tabs 27. The remaining frontside contact leads are available for connecting electrodes on the semiconductor chip to external circuits. However, not all leads, such as the lead 25, are utilized necessarily in a particular semiconductor chip design. All of the lead portions comprising the external contacts are fabricated and retained within the molded body to enhance mechanical strength and package uniformity. Unused members such as the lead 25 may be removed later depending on specific design needs. The tab 32 on the one end lead 24 provides identification.

It will be appreciated that herein lies the design flexibility of this lead frame arrangement. A simple change in the etch mask design can produce a variety of lead member configurations enabling accommodation to a wide variety of electrode patterns on the frontside of the semiconductor chip 23. The frontside contact members 24 may have a variety of configurations on the frontside lead ends and may omit various lead ends to adapt to various arrangements of electrodes on the front surface of the chip. If desired, the backside contact tabs 27 also may be altered in shape, location, or partially omitted, as previously described. Alternatively, some of the backside contact tabs 27 may be omitted, and their respective leads 26 may be used for connecting to semiconductor chip electrodes 28.

After the frontside contacts 24 have been bonded to the electrodes 28 on the semiconductor chip 23, the tape is reeled up, advantageously with an interleaving member which ensures that the semiconductor chips are suspended by the attached leads and therefore are available for cleaning or other processing. Thus, for example, the entire reel may be batch processed by immersion in a cleaning bath or treatment in a bake oven.

Subsequently, the tape is fed into another work station, and the backside tab members 27 are folded through 180 degrees to place them in the orientation indicated in FIG. 2 by the partially dotted outlines. This step is carried out by tool means to bend the tab members in the area 29 thereby to provide a clearance equal generally to the thickness of the semiconductor chip 23. Thus the backside contact tabs 27 make substantially planar contact with the back surface of the semiconductor chip.

The backside contact tabs 27 may be conductively attached by any of the various means previously ascribed to the term "bonded" to produce electrical or thermal contact between the tabs and chip. If a conductive epoxy is used, it is usually cured in an oven. As previously indicated, thermal or electrical interconnection, or both, to the backside contact tabs 27 is made ultimately through the lead members 26.

Next, the tape portion 20 which remains a part of a reel, with the semiconductor chip contacted both front and back as described above, is fed into a mold wherein the plastic molded body 10 is produced as shown in FIG. 1. In some instances, it may be advantageous, before the molding step, to apply a protective coating to the active surface of the semiconductor chip. This may be a conformal coating material such as an appropriate silicone rubber which vulcanizes at room temperature.

In a specific embodiment the body 10 is injection molded using a thermoplastic material such as Ryton BR06-A. Ryton is a trademark of Phillips Petroleum Corp. Thermoplastic material generally does not require a postmolding cure period, and the molding process may be accomplished in the order of seconds, typically from about six to twenty.

The injection molded body 10 may be formed at a plurality of tape sites simultaneously, and the molding apparatus may accommodate more than one tape. Next, in further reel-to-reel processing, the molded packages are deflashed to remove excess molding material and cleaned. Finally, in further reel-to-reel processing, each molded package is excised from the tape, and the external leads are formed and trimmed. The individual packages then are fed automatically in uniform orientation into a stick-type magazine. One feature of the excising, trimming, and bending operations is that they are performed subsequent to the package molding step. Thus, there is inherent mechanical support for the lead frame assembly during those operations. The use of spectral jigs or other supports to prevent deflection or distortion of the lead frame assembly during the metal-working steps is avoided.

Figure 5:
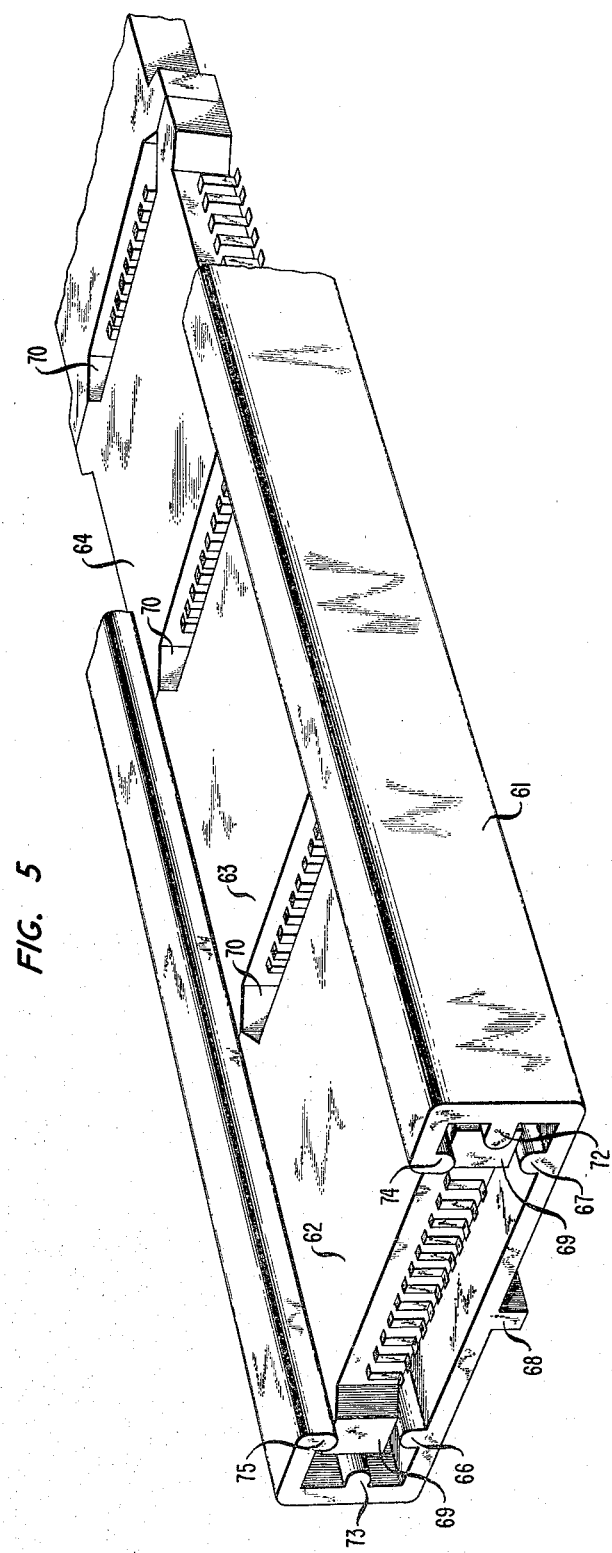
FIG. 5 is a perspective view, partially cut away and sectioned, showing the package in accordance with this invention in a stick-type of magazine.

Referring to FIG. 5, a portion 61 of a stick magazine is shown containing several packages 62, 63, 64. The plastic body of each of the packages 62, 63, 64 bears on the internal rails 66–67, 72–73, 74–75. These rails ensure suspension of the packages in the stick in such a way that the external leads 71 do not contact any internal surfaces of the stick. The rail suspension arrangement also provides clearance all around the package so that debris within the stick will not hinder movement of the packages. The corners 69 of the molded packages extend beyond the external leads 71 and ensure that the leads of one package do not contact those of an adjacent package or the side rails 72–73.

The packages are most advantageously handled when loaded into sticks from which they may be fed and reinserted during various testing, aging, and other operations.

We claim:

1. An encapsulation containing a semiconductor integrated circuit chip, said chip having front and back sides, at least said front side having electrodes thereon, the encapsulation comprising a molded plastic body member encompassing the semiconductor chip, characterized in that the encapsulation includes unitary lead members for providing interconnection between electrodes on the chip and terminals external to the encapsulation, a first group of said lead members each having a termination internal to the encapsulation in contact with electrodes on the front side of the chip, a second group of said lead members, separate from said first group, which have terminations internal to the encapsulation comprising not more than four large area tab members, each of which contacts about 20 percent of the backside of said chip.

2. An encapsulation in accordance with claim 1 characterized in that the encapsulation is rectilinear in configuration, and each pair of external terminations adjacent each corner are connected to one of said large area tab members.

3. An encapsulation in accordance with claim 2 characterized in that the corner portions of said molded plastic body project further from the body than the external terminations.

* * * * *